(12) United States Patent
Yeduru et al.

(10) Patent No.: US 9,589,880 B2
(45) Date of Patent: Mar. 7, 2017

(54) METHOD FOR PROCESSING A WAFER AND WAFER STRUCTURE

(71) Applicant: Infineon Technologies AG, Neubiberg (DE)

(72) Inventors: Srinivasa Reddy Yeduru, Villach (AT); Karl Heinz Gasser, Spittal Drau (AT); Stefan Woehlert, Villach (AT); Karl Mayer, Villach (AT); Francisco Javier Santos Rodriguez, Villach (AT)

(73) Assignee: INFINEON TECHNOLOGIES AG, Neubiberg (DE)

( * ) Notice: Subject to any disclaimer, the term of this patent is extended or adjusted under 35 U.S.C. 154(b) by 0 days.

(21) Appl. No.: 14/049,340

(22) Filed: Oct. 9, 2013

(65) Prior Publication Data
US 2015/0097294 A1    Apr. 9, 2015

(51) Int. Cl.
*H01L 21/04*    (2006.01)
*H01L 23/498*    (2006.01)
(Continued)

(52) U.S. Cl.
CPC .... *H01L 23/49838* (2013.01); *H01L 21/4814* (2013.01); *H01L 21/6835* (2013.01);
(Continued)

(58) Field of Classification Search
CPC .............. H01L 21/02697; H01L 21/16; H01L 21/0334; H01L 21/4814; H01L 21/02104;
(Continued)

(56) References Cited

U.S. PATENT DOCUMENTS

| 5,508,206 A | * | 4/1996 | Glenn | ............... H01L 31/03528 |
| | | | | 136/256 |
| 5,922,496 A | * | 7/1999 | Dalal | ........................ G03F 7/40 |
| | | | | 101/127 |

(Continued)

FOREIGN PATENT DOCUMENTS

CN      103021962 A     4/2013
DE   102006015781 A1   10/2007

OTHER PUBLICATIONS

Daimo Corp. "Development of the TAIKO process, a new process method for wafer Backgrinding" dated Nov. 28, 2005, available online at http://www.disco.co.jp/eg/news/ product/20051128.*

(Continued)

*Primary Examiner* — Matthew Landau
*Assistant Examiner* — Grant Withers

(57) ABSTRACT

A method for processing a wafer in accordance with various embodiments may include: removing wafer material from an inner portion of the wafer to form a structure at an edge region of the wafer to at least partially surround the inner portion of the wafer, and printing material into the inner portion of the wafer using the structure as a printing mask. A method for processing a wafer in accordance with various embodiments may include: providing a carrier and a wafer, the wafer having a first side and a second side opposite the first side, the first side of the wafer being attached to the carrier, the second side having a structure at an edge region of the wafer, the structure at least partially surrounding an inner portion of the wafer; and printing material onto at least a portion of the second side of the wafer.

26 Claims, 4 Drawing Sheets

(51) Int. Cl.
*H01L 21/48* (2006.01)
*H01L 21/683* (2006.01)
*H01L 23/00* (2006.01)

(52) U.S. Cl.
CPC .............. *H01L 24/03* (2013.01); *H01L 24/27* (2013.01); *H01L 24/29* (2013.01); *H01L 24/94* (2013.01); *H01L 24/05* (2013.01); *H01L 24/30* (2013.01); *H01L 24/32* (2013.01); *H01L 24/83* (2013.01); *H01L 2221/6834* (2013.01); *H01L 2221/68327* (2013.01); *H01L 2224/03002* (2013.01); *H01L 2224/04026* (2013.01); *H01L 2224/0508* (2013.01); *H01L 2224/05082* (2013.01); *H01L 2224/05083* (2013.01); *H01L 2224/05084* (2013.01); *H01L 2224/05571* (2013.01); *H01L 2224/05624* (2013.01); *H01L 2224/05639* (2013.01); *H01L 2224/05647* (2013.01); *H01L 2224/05655* (2013.01); *H01L 2224/05664* (2013.01); *H01L 2224/05666* (2013.01); *H01L 2224/05671* (2013.01); *H01L 2224/05687* (2013.01); *H01L 2224/27002* (2013.01); *H01L 2224/27005* (2013.01); *H01L 2224/2732* (2013.01); *H01L 2224/2747* (2013.01); *H01L 2224/29011* (2013.01); *H01L 2224/29014* (2013.01); *H01L 2224/2919* (2013.01); *H01L 2224/29021* (2013.01); *H01L 2224/29023* (2013.01); *H01L 2224/2929* (2013.01); *H01L 2224/29035* (2013.01); *H01L 2224/29036* (2013.01); *H01L 2224/29111* (2013.01); *H01L 2224/29147* (2013.01); *H01L 2224/29294* (2013.01); *H01L 2224/29339* (2013.01); *H01L 2224/29347* (2013.01); *H01L 2224/29393* (2013.01); *H01L 2224/32245* (2013.01); *H01L 2224/94* (2013.01); *H01L 2924/12042* (2013.01)

(58) Field of Classification Search
CPC ......... H01L 21/02107; H01L 21/02365; H01L 21/49838; H01L 23/16; H01L 23/49838
USPC .......................................................... 438/459
See application file for complete search history.

(56) References Cited

U.S. PATENT DOCUMENTS

| | | | | |
|---|---|---|---|---|
| 6,734,570 | B1 * | 5/2004 | Archer | 257/786 |
| 7,148,125 | B2 * | 12/2006 | Suzuki et al. | 438/459 |
| 7,358,176 | B2 * | 4/2008 | Huang | H01L 24/05 101/129 |
| 7,507,638 | B2 * | 3/2009 | Mancini et al. | 438/459 |
| 7,622,328 | B2 * | 11/2009 | Masuda | 438/106 |
| 8,062,958 | B2 * | 11/2011 | Wood et al. | 438/459 |
| 8,857,805 | B2 * | 10/2014 | Lackner et al. | 269/289 R |
| 2001/0033995 | A1 * | 10/2001 | Tanaka et al. | 430/311 |
| 2002/0104449 | A1 * | 8/2002 | Lee | H01L 24/11 101/129 |
| 2003/0235937 | A1 * | 12/2003 | Mong | H01L 21/6835 438/106 |
| 2004/0259322 | A1 * | 12/2004 | Lu et al. | 438/426 |
| 2005/0250052 | A1 * | 11/2005 | Nguyen | 430/322 |
| 2006/0003255 | A1 * | 1/2006 | Wood et al. | 430/270.1 |
| 2006/0286768 | A1 * | 12/2006 | Arana | H01L 21/306 438/455 |
| 2007/0004173 | A1 * | 1/2007 | Kirby | H01L 29/0657 438/459 |
| 2007/0091247 | A1 * | 4/2007 | Onda | 349/153 |
| 2007/0199456 | A1 * | 8/2007 | Kang | B41F 15/42 101/123 |
| 2007/0270536 | A1 * | 11/2007 | Sachdev et al. | 524/440 |
| 2008/0014679 | A1 * | 1/2008 | Shen et al. | 438/106 |
| 2008/0022870 | A1 * | 1/2008 | Stamme | B41F 31/26 101/129 |
| 2008/0242052 | A1 * | 10/2008 | Feng et al. | 438/459 |
| 2009/0314336 | A1 * | 12/2009 | Nakatani | B41F 15/20 136/252 |
| 2010/0009519 | A1 * | 1/2010 | Seddon | H01L 21/6836 438/464 |
| 2011/0045627 | A1 * | 2/2011 | Sachs et al. | 438/71 |
| 2012/0094442 | A1 * | 4/2012 | Lin et al. | 438/118 |
| 2013/0001766 | A1 * | 1/2013 | Takyu et al. | 257/734 |
| 2013/0069205 | A1 | 3/2013 | Ning | |
| 2014/0076846 | A1 * | 3/2014 | Feng et al. | 216/33 |
| 2014/0318612 | A1 * | 10/2014 | Chou et al. | 136/256 |
| 2015/0162235 | A1 * | 6/2015 | Jeon | H01L 21/6835 438/459 |

OTHER PUBLICATIONS

English language abstract of DE 10 2006 015 781 A1 dated Feb. 5, 2014.

\* cited by examiner

METHOD FOR PROCESSING A WAFER AND WAFER STRUCTURE

TECHNICAL FIELD

Various embodiments relate generally to a method for processing a wafer and to a wafer structure.

BACKGROUND

Printing methods such as, e.g., stencil printing or screen printing may be used in semiconductor technologies to produce layers, for example on a wafer, e.g. on a wafer backside. Using current methods, however, layers thinner than approximately 25 µm are difficult to produce. Further, current production methods suffer from wide variations in layer uniformity. In various conventional methods, the backside of a wafer is coated using techniques such as screen-printing, stencil printing, or spin coating. With stencil printing, it is difficult to obtain an even coating thickness over the entire area of the wafer. This non-uniform disposition of material on the wafer may lead to the formation of additional stress lines in the wafer that can cause wafer breakage during dicing, particularly when the wafer is very thin. Stencil thickness may determine or limit the thickness of the deposited layer and using current techniques, the thinnest stencil possible is about 25 µm. With spin coating, it is possible to cover the entire wafer with a given material, but spin coating is much slower than the previously mentioned processes and large amounts of wasted material is produced.

SUMMARY

In accordance with one or more embodiments of the disclosure, a method for processing a wafer is provided. The method may include, removing wafer material from an inner portion of the wafer to form a structure at an edge region of the wafer to at least partially surround the inner portion of the wafer; and printing material into the inner portion of the wafer by using the structure as a printing mask.

In accordance with one or more embodiments of the disclosure, a wafer structure is provided. The structure may include a wafer; a structure formed at an edge region of the wafer to at least partially surround an inner portion of the wafer and the structure having an upper surface; and printed material in the inner portion of the wafer, wherein the upper surface of the printed material and the upper surface of the structure are level with each other.

In accordance with one or more embodiments of the disclosure, a method for processing a wafer is provided. The method may include providing a carrier and a wafer, the wafer having a first side and a second side opposite the first side, the first side of the wafer being attached to the carrier, the second side having a structure at an edge region of the wafer, the structure at least partially surrounding an inner portion of the wafer, and printing material onto at least a portion of the second side of the wafer.

BRIEF DESCRIPTION OF THE DRAWINGS

In the drawings, like reference characters generally refer to the same parts throughout the different views. The drawings are not necessarily to scale, emphasis instead generally being placed upon illustrating the principles of the invention. In the following description, various embodiments of the invention are described with reference to the following drawings, in which.

DETAILED DESCRIPTION

The following detailed description refers to the accompanying drawings that show, by way of illustration, specific details and embodiments in which the invention may be practiced.

The word "exemplary" is used herein to mean "serving as an example, instance, or illustration". Any embodiment or design described herein as "exemplary" is not necessarily to be construed as preferred or advantageous over other embodiments or designs.

The word "over" used concerning a deposited material formed "over" a side or surface may be used herein to mean that the deposited material may be formed "directly on", e.g. in direct contact with, the implied side or surface. The word "over" used with regards to a deposited material formed "over" a side or surface, may be used herein to mean that the deposited material may be formed "indirectly on" the implied side or surface with one or more additional layers being arranged between the implied side or surface and the deposited material.

The current disclosure provides for an improved method of printing thin layers of material on a wafer substrate. Methods provided in accordance with various embodiments may make it possible to print uniform layers less than 10 µm thick.

Methods provided in accordance with various embodiments may reduce or eliminate at least some of the disadvantages present in current wafer coating methods.

Figure 1:
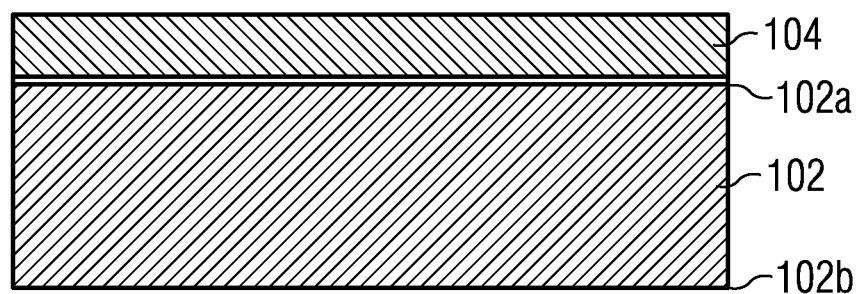
FIG. 1 shows a wafer attached to a support structure in accordance with various embodiments.

In accordance with various embodiments of the disclosure, a method for processing a wafer is provided. The method may include, as illustrated in FIG. 1, using a wafer 102 attached to a supporting structure 104. The supporting structure 104 may be attached to a first side 102a of the wafer 102. In one or more embodiments, the first side 102a may be a front side of the wafer 102. The wafer 102 may include or may be composed of material appropriate for a given application, for example a semiconductor material such as silicon, germanium, silicon germanium, silicon carbide, gallium nitride, gallium arsenide, or other elemental and/or compound semiconductors. The wafer 102 may also include other materials or combinations of material, for example various dielectrics, metals and/or polymers as are appropriate for a given application. The support structure 104 may include or may be composed of, for example, glass, silicon and/or various polymers.

Figure 2:
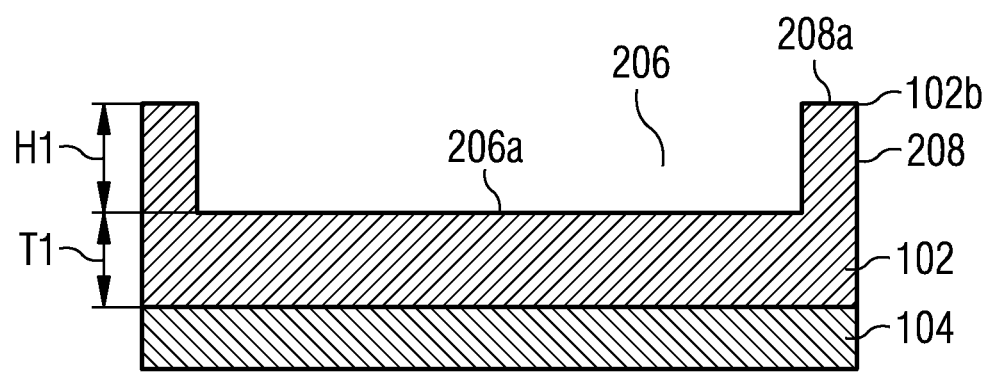
FIG. 2 shows the wafer in accordance with various embodiments after material has been removed from an inner portion of the wafer at the backside of the wafer.

As illustrated in FIG. 2, the method may include removing wafer material from an inner portion 206 at a second side 102b of the wafer 102 to form a thinned wafer structure with thickness T1 and a protruding structure 208 at an edge region of the wafer 102 to at least partially surround the inner portion 206 of the wafer 102. According to various embodiments, structure 208 protrudes from a surface 206a of the inner portion 206 obtained after removing the wafer material from the inner portion 206. In one or more embodiments, the surface 206a may include or may be a surface that faces in the same or substantially the same direction as the second side 102b of the wafer 102. In one or more embodiments, the second side 102b of the wafer 102 may be a backside of the wafer 102. In one or more embodiments, the thickness T1 may be the distance between the first side (e.g. front side) 102a of the wafer 102 and the surface 206a of the inner portion 206 of the wafer 102. According to one embodiment, the protruding structure 208 at the edge region of the wafer 102 is a ring structure, which at least partially surrounds the inner portion 206 of the wafer 102.

According to a further embodiment, the protruding structure 208 at the edge region of the wafer 102 may be a ring structure, which completely encloses the inner portion 206 of the wafer 102.

In one or more embodiments, the protruding structure 208 at the edge region of the wafer 102 may be a circular ring structure, which at least partially surrounds but may completely enclose the inner portion 206 of the wafer 102.

In one or more embodiments, the protruding structure 208 at the edge region of the wafer 102 may be a non-circular ring structure, which at least partially surrounds but may completely enclose the inner portion 206 of the wafer 102.

In one or more embodiments, the protruding structure 208 at the edge region of the wafer 102 may be a polygonal or substantially polygonal structure, which at least partially surrounds but may completely enclose the inner portion 206 of the wafer 102.

In one or more embodiments, the protruding structure 208 at the edge region of the wafer 102 may be a rectangular or substantially rectangular structure, which at least partially surrounds but may completely enclose the inner portion 206 of the wafer 102.

In one or more embodiments, the protruding structure 208 at the edge region of the wafer 102 may be a square or substantially square structure, which at least partially surrounds but may completely enclose the inner portion 206 of the wafer 102.

In one or more embodiments, the protruding structure 208 at the edge region of the wafer 102 may be an annular or substantially annular structure, which at least partially surrounds but may completely enclose the inner portion 206 of the wafer 102.

In one or more embodiments, the protruding structure 208 at the edge region of the wafer 102 may be an elliptical or substantially elliptical structure, which at least partially surrounds but may completely enclose the inner portion 206 of the wafer 102.

In one or more embodiments, the protruding structure 208 at the edge region of the wafer 102 may be formed to any shape necessary for a given application.

According to one embodiment, the protruding structure 208 at the edge region of the wafer 102 has a height H1 of less than or equal to 25 µm, e.g. less than or equal to 20 µm, e.g. less than or equal to 10 µm, e.g. less than or equal to 5 µm, for example in the range from 5 µm to 25 µm, e.g. about 10 µm or about 5 µm. The height H1, in accordance with various embodiments, may be the distance between the surface 206a of the inner portion 206 and a top surface 208a of the protruding structure 208. In one or more embodiments, the top surface 208a of the protruding structure 208 may include or may be a surface that faces in the same or substantially the same direction as the second side 102b of the wafer 102 and/or as the surface 206a of the inner portion 206 of the wafer 102.

According to one embodiment, the protruding structure 208 at the edge region of the wafer 102 may be achieved through a so-called Taiko process, e.g., which process leaves a ring of a few millimeters in width on the edge region of a wafer and removes material only from the inner area of the backside of the wafer though a grinding process. In this case, the protruding structure 208 may be configured as a so-called Taiko ring in accordance with one or more embodiments.

According to one embodiment, the protruding structure 208 at the edge region of the wafer 102 may be formed by grinding wafer material from the inner portion 206 of the wafer 102. Alternatively, material may be removed from the inner portion 206 through many different means, e.g. etching, various chemical-mechanical methods, laser cutting, etc. Through these methods, the inner portion 206 may be shaped to meet the dimensions required by a given application.

Figure 3:
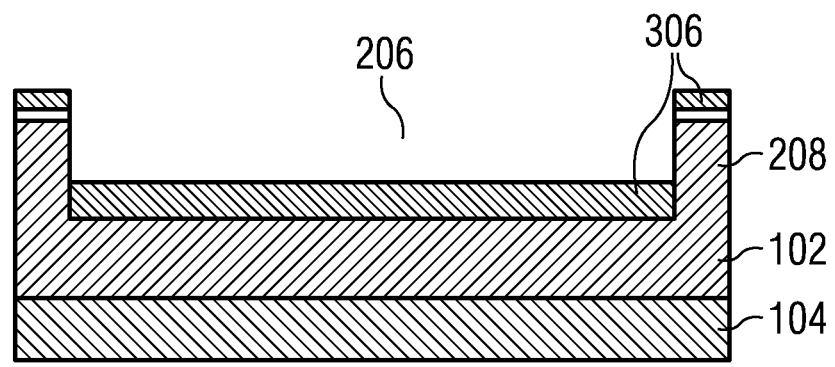
FIG. 3 shows a metallization layer on the backside of the wafer in accordance with various embodiments.

As illustrated in FIG. 3, in one or more embodiments, the method may further include forming a metallization layer 306 in the inner portion 206 and on top of the structure 208 after the wafer material is removed. The metallization layer 306 may be formed from any elemental metal or metal alloy as appropriate for a given application. Some metals or metal alloys that may be used according to various embodiments include: Ag, Al, Cu, Cr, Ni, Ti, Pd, NiV, NiP, TiN, and AlSiCu. In one or more embodiments, the metallization layer 306 may be a single layer. In one or more embodiments, the metallization layer 306 may be a layer stack including or being composed of a plurality of sublayers stacked on top of each other. In one or more embodiments, one or more sublayers of the layer stack may include or may be composed of at least one of the aforementioned metals or metal alloys. For example, in one or more embodiments, the layer stack may include or may be a Ti/NiV/Ag layer stack, an Al/Ti/Ag layer stack, an Al/Ti/NiV/Ag layer stack, an Al/Ti/Ni/Ti/Ag layer stack, an AlSiCu/Ti/AlSiCu/NiP/Pd layer stack, or an Al/Ti/TiN/Ti/Ni/Ti/Ag layer stack. The thickness of metallization layer 306, according to various embodiments, may be between 500 nm and 10 µm, e.g. between 500 nm and 5 µm.

Figure 4:
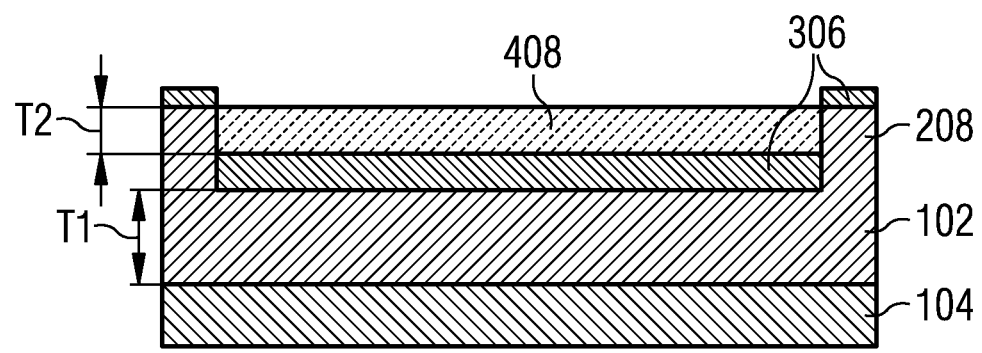
FIG. 4 shows the wafer in accordance with various embodiments where the inner portion of the wafer is filled with a given material.

As illustrated in FIG. 4, the method may further include filling the inner portion 206 of the wafer 102 with a given material 408, for example, such that the top of the material 408 is at the same level as the top of the protruding edge region structure 208.

In one or more embodiments, the material 408 may be an electrically conductive material, for example a conductive epoxy material, for example, a metallic epoxy such as, e.g., silver epoxy (Ag-epoxy), or the like. However, the material 408 may include or may be other materials as well.

The inner portion 206 of wafer 102 may be filled with the material 408 by a printing process, as described in the following.

Figure 5A:
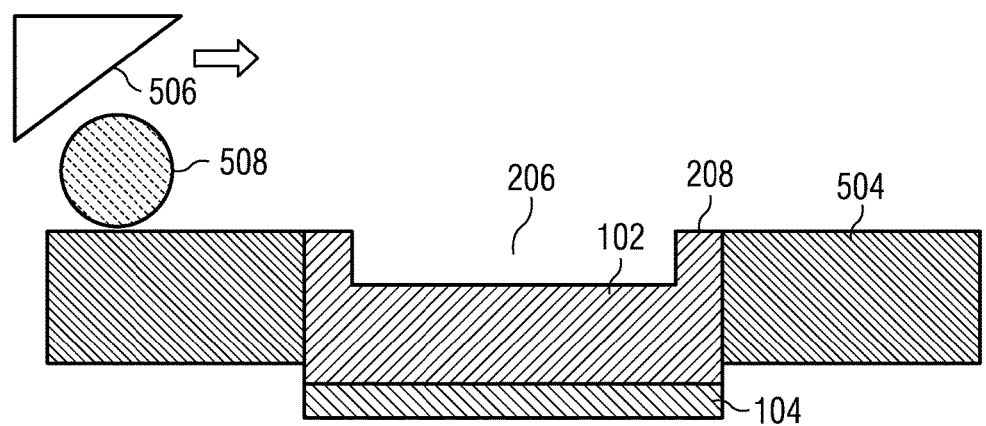
FIG. 5A shows the wafer in accordance with various embodiments mounted in a printing stencil and a printable material that may be wiped or squeegeed across the surface of the wafer to deposit the printable material into the inner portion of the wafer.

As illustrated in FIG. 5A, in one or more embodiments, the method may further include placing the modified wafer 102 inside a stencil 504 so that the top of the protruding edge region structure 208 is at the same level (or at least substantially the same level) as the top of the stencil 504. Although not shown in FIG. 5A, the metallization layer 306 may be provided in one or more embodiments. In this case, the top of the metallization layer 306 may be at the same level (or at least substantially the same level) as the top of the stencil 504. A printing material 508 may be spread across the surface of the wafer, using a squeegee 506 or similar device, and into the inner portion 206 of modified wafer 102 using the protruding edge region structure 208 as a printing mask. This process may be conceptualized as a form of intaglio printing, whereby a void may be formed in the wafer material and the printed material is wiped across the surface of the wafer, resulting in a portion of the printed material being deposited into and filling the void.

Figure 5B:
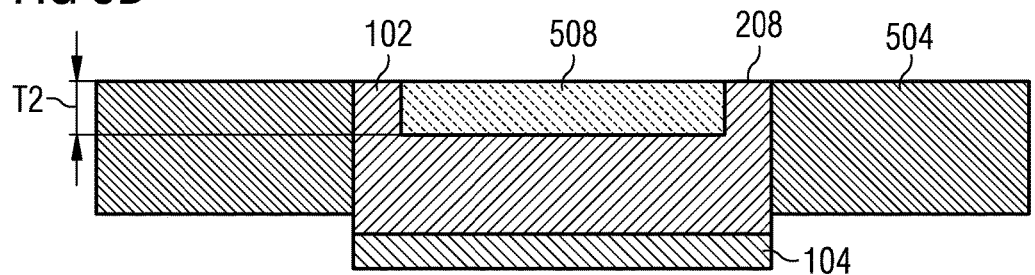
FIG. 5B shows the wafer mounted in the printing stencil where the printable material has been squeegeed into the inner portion of the wafer.

As illustrated in FIG. 5B, after the printed material 508 is wiped or spread across the surface of the modified wafer 102, the inner portion 206 may be completely filled with printed material 508. The thickness T2 of the printed material 508 may be controlled by altering the height H1 of the edge region structure 208. By altering the height H1 of protruding structure 208, it may be possible to form a printed layer 508 of almost any thickness T2 necessary for a given application. For example, in one or more embodiments, the thickness T2 of the printed layer 508 may be the less than or equal to the height H1 of the protruding structure 208.

According to one embodiment, the printed material 508 is printed with a material thickness T2 of less than or equal to 25 µm, e.g. less than or equal to 20 µm, e.g. less than or equal to 15 µm, e.g. less than or equal to 10 µm, e.g. less than or equal to 5 µm, e.g. about 10 µm or about 5 µm.

According to another embodiment, the printed material 508 may include or may be an epoxy material, for example an insulator/dielectric based epoxy, a metal-based epoxy, and/or a carbon nanotube based epoxy. The epoxy material may be a conductive epoxy, for example a metallic epoxy, such as a silver epoxy. The printed material 508 may be composed of any type of metallic epoxy appropriate for a given application, for example a Ag-based epoxy, a Cu-based epoxy, and/or a Ag/Cu-based epoxy.

According a further embodiment, the printed material 508 may include or may be a metal, for example, elemental silver or a silver alloy. The printed material may also be any metal suitable for a given application, for example Cu, Sn, Ag, Cu/Sn (alloy containing Cu and Sn), Sn/Ag (alloy containing Sn and Ag), and/or Cu/Ag (alloy containing Cu and Ag).

Figure 5C:
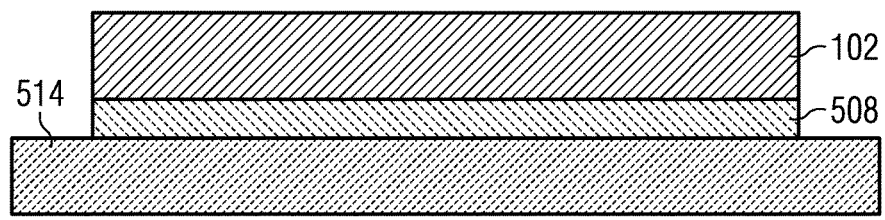
FIG. 5C shows the wafer with the printed material where structures formed at the edge region of the wafer have been removed and the printed material has been attached to a carrier.

According to a further embodiment, as illustrated in FIG. 5C, after the printed material 508 has been printed into the inner portion 206 of the wafer 102, protruding edge region structure 208 may be removed by, for example, a dicing process, a grinding process, or by laser cutting (e.g. prior to dicing). Support structure 104 may also be removed from wafer 102. The wafer 102 may be diced to obtain one or more plurality of singulated dies, wherein the die or dies may be coated with the printed material 508. The die or dies including the printed material 508 may then be attached to a carrier 514 with the printed material 508 facing the carrier 514. The carrier 514 may, for example, be a lead frame, or any other carrier appropriate for a given application.

In one or more embodiments, a thin wafer backside coating may be achieved through the printing process described herein. For example, a thin layer of printed material 508, e.g. having a thickness T2 of about 5 µm, may be produced on the back side of a wafer or die.

In one or more embodiments, high adhesion strength of the die or dies to the carrier (e.g. lead frame) 514 may be achieved through the thin layer of printed material 508.

In one or more embodiments, high thermal conductivity may be achieved through the thin layer of printed material 508.

In one or more embodiments, low electrical resistance may be achieved through the thin layer of printed material 508.

In one or more embodiments, a total thickness variation of the printed material 508 (in other words, a total variation of the thickness T2 of the printed material 508) may be small, for example less than 10 µm in one or more embodiments, e.g. less than 5 µm in one or more embodiments, e.g. less than 1 µm in one or more embodiments.

An aspect of the present disclosure may be seen in that, instead of using the thickness of a stencil as a main controlling parameter for stencil printing, a protruding structure at an edge region of a wafer (e.g., a ring structure, e.g. a Taiko ring obtained after backside grinding of the wafer) may be used as a mask for stencil printing. In one or more embodiments, the thickness or height H1 of this structure (e.g. thickness or height of the ring structure, e.g. Taiko ring) may define the thickness T2 of a printed layer (e.g. printed epoxy layer) after stencil printing.

When printing materials onto a thinned wafer structure, structural integrity issues may arise if the wafer, or a portion thereof, is too thin. A thinned wafer may fracture or break during the various conventional printing processes due to the inherent mechanical stresses imposed on the wafer during these processes. Due to these stresses, it is difficult to work with wafer structures thinner than approximately 175 µm using conventional methods.

Methods provided in accordance with various embodiments may reduce or eliminate at least some of the disadvantages present in current thin-wafer printing methods.

In accordance with various embodiments of the disclosure, a method for processing a wafer is provided. The method may include, as illustrated in FIG. 1, using a wafer 102 attached to a carrier 104. The method may further include, as illustrated in FIG. 2, removing wafer material from an inner portion 206 at a second side 102b of the wafer 102 to form a thinned wafer structure with thickness T1 and a protruding structure 208 at an edge region of the wafer 102 to at least partially surround the inner portion 206 of the wafer 102. According to various embodiments, structure 208 protrudes from a surface 206a of the inner portion 206 of the wafer 102, for example by height H1 as described herein above. According to various embodiments, structure 208 may be configured as a reinforcement structure to increase mechanical stability of the wafer. According to various embodiments, the carrier 104 attached to the wafer 102 may be configured to further increase mechanical stability.

Figure 6:
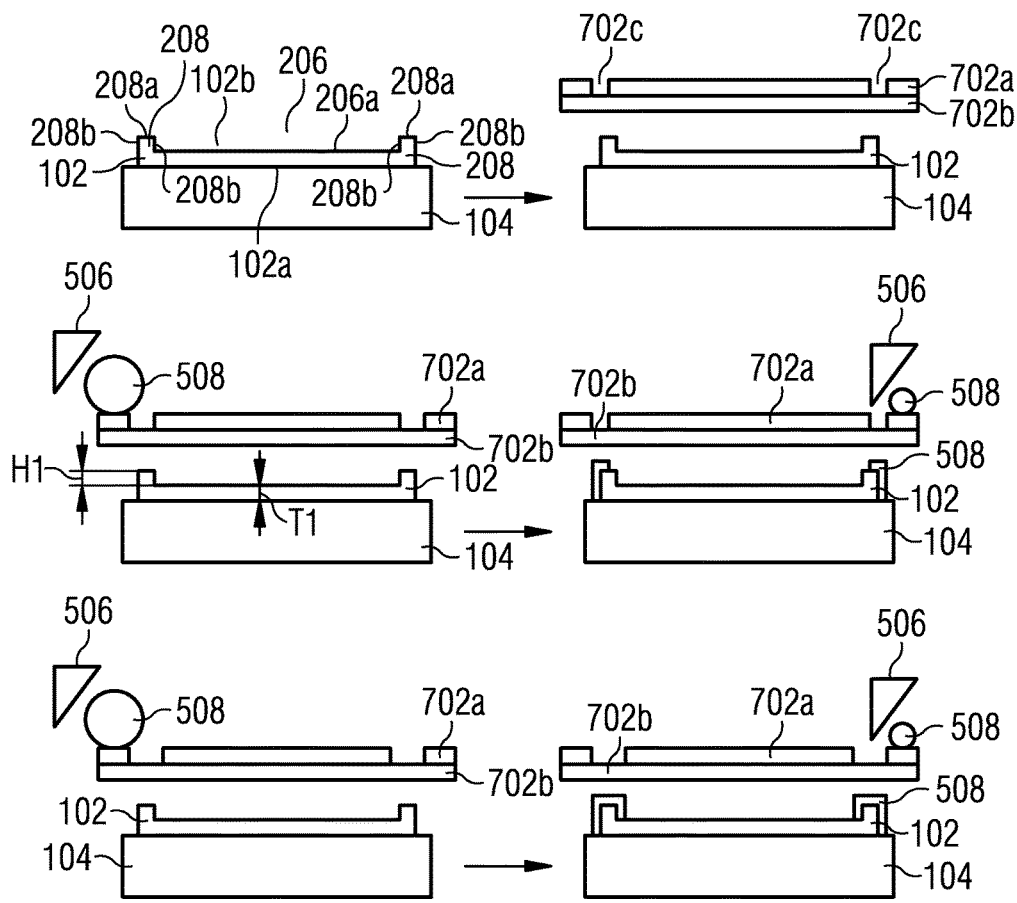
FIG. 6 shows a wafer attached to a support structure in accordance with various embodiments with a print screen or stencil being used to print material through openings in the print screen or stencil onto a back side of a wafer, e.g. onto a reinforcement structure (e.g. Taiko ring structure) and/or onto other parts of the back side of the wafer.

The method may further include as illustrated in FIG. 6, printing material on at least a portion of the second side 102b of the wafer 102. The method may further include printing material on at least a portion of second side 102b of the wafer 102 using a printing mask, for example a structure printing mask, for example at least one of a print stencil (also referred as stencil mask), a print screen (also referred as screen mask), and a peelable photolayer (e.g. peelable photoresist). For example, in accordance with one or more embodiments a screen 702b with a mask layer (e.g. emulsion) 702a disposed thereon may be used as a printing mask, as shown in FIG. 6.

According to one or more embodiments, as illustrated in FIG. 6, the combined thickness of height H1 of protruding structure 208 and the thickness T1 (i.e. H1+T1) may be greater than or equal to 200 µm, e.g. in the range from 200 µm to 1 mm, e.g. in the range from 200 µm to 700 µm, e.g. in the range from 200 µm to 600 µm, e.g. H1+T1=800 µm, e.g. H1=760 µm and T1=40 µm. In one or more embodiments, the combined thickness H1+T1 may correspond to a thickness of the wafer 102 before the wafer material has been removed from the inner portion 206 of the wafer 102. In one or more embodiments, the relationship between the thickness T1 and the height H1 varies inversely, i.e. as the thickness T1 decreases, the height H1 increases.

In one or more embodiments, the second side 102b of the wafer 102 may be a backside of the wafer 102.

In one or more embodiments, the protruding structure 208 at the edge region of the wafer 102 may be a ring structure, which at least partially surrounds but may completely enclose the inner portion 206 of the wafer 102.

In one or more embodiments, the protruding structure 208 at the edge region of the wafer 102 may be a non-circular ring structure, which at least partially surrounds but may completely enclose the inner portion 206 of the wafer 102.

In one or more embodiments, the protruding structure 208 at the edge region of the wafer 102 may be a polygonal or substantially polygonal structure, which at least partially surrounds but may completely enclose the inner portion 206 of the wafer 102.

In one or more embodiments, the protruding structure 208 at the edge region of the wafer 102 may be a rectangular or substantially rectangular structure, which at least partially surrounds but may completely enclose the inner portion 206 of the wafer 102.

In one or more embodiments, the protruding structure 208 at the edge region of the wafer 102 may be a square or substantially square structure, which at least partially surrounds but may completely enclose the inner portion 206 of the wafer 102.

In one or more embodiments, the protruding structure 208 at the edge region of the wafer 102 may be an annular or substantially annular structure, which at least partially surrounds but may completely enclose the inner portion 206 of the wafer 102.

In one or more embodiments, the protruding structure 208 at the edge region of the wafer 102 may be an elliptical or substantially elliptical structure, which at least partially surrounds but may completely enclose the inner portion 206 of the wafer 102.

In one or more embodiments, the protruding structure 208 at the edge region of the wafer 102 may be formed to any shape necessary for a given application, which at least partially surrounds but may completely enclose the inner portion 206 of the wafer 102.

In one or more embodiments, the supporting structure (carrier) 104 may be attached to a first side 102a of the wafer 102. The first side 102a may be a front side of the wafer 102. The wafer 102 may include or may be composed of material appropriate for a given application, for example a semiconductor material such as silicon, germanium, silicon germanium, silicon carbide, gallium nitride, gallium arsenide, or other elemental and/or compound semiconductors. The wafer 102 may also include other materials or combinations of material, for example various dielectrics, metals and/or polymers as are appropriate for a given application. The support structure 104 may include or may be composed of, for example, glass, silicon and/or various polymers.

In accordance with various embodiments of the disclosure, a method for processing a wafer is disclosed, in accordance with various embodiments the method may include removing wafer material from an inner portion 206 of the wafer 102 to form a structure 208 at an edge region of the wafer to at least partially surround the inner portion 206 of the wafer 102 and printing material into the inner portion 206 of the wafer using the structure as a printing mask. In accordance with various embodiments, the structure 208 may be protruding from a surface 206a of the inner portion 206 of the wafer 102.

In one or more embodiments, the protruding structure 208 may be a ring structure arranged to at least partially surround the inner portion 206 of the wafer 102.

In one or more embodiments, the ring structure may enclose the inner portion 206 of the wafer 102.

In one or more embodiments, the ring structure may be a circular ring structure.

In one or more embodiments, the ring structure may be a Taiko ring structure. In one or more embodiments, the protruding structure 208 may have a height H1 of less than or equal to 25 µm.

In one or more embodiments, removing wafer material from the inner portion 206 of the wafer 102 may include grinding wafer material from the inner portion 206 of the wafer 102.

In one or more embodiments, removing wafer material from the inner portion 206 of the wafer 102 may include removing wafer material from the inner portion 206 of a backside 102b of the wafer 102.

In one or more embodiments, the printed material 508 may be printed with a material thickness T2 of less than or equal to 25 µm.

In one or more embodiments, the printed material 508 may be epoxy material.

In one or more embodiments, the epoxy material may be a metal epoxy.

In one or more embodiments, the printed material 508 may be an elemental metal or metal alloy.

In accordance with various embodiments of the disclosure, a wafer structure is disclosed, said wafer structure may include a wafer 102; a structure 208 formed at an edge region on one side of the wafer 102, where the structure 208 at least partially surrounds an inner portion 206 of the wafer 102; and printed material 508 in the inner portion 206 of the wafer 102, where an upper surface of the printed material 508 and an upper surface of the structure 208 may be level with each other.

In one or more embodiments, the structure 208 may be a ring structure that at least partially surrounds the inner portion 206 of the wafer 102.

In one or more embodiments, the ring structure may enclose the inner portion 206 of the wafer 102.

In one or more embodiments, the ring structure may be a circular ring structure.

In one or more embodiments, the ring structure may be a Taiko ring structure.

In one or more embodiments, the structure 208 has a height of less than or equal to 25 µm.

In one or more embodiments, the structure 208 is formed on a backside 102b of the wafer 102.

In one or more embodiments, the printed material 508 may be printed with a material thickness of less than or equal to 25 μm.

In one or more embodiments, the printed material 508 may be epoxy material.

In one or more embodiments, the epoxy material may be a metal epoxy.

In one or more embodiments, the printed material 508 may be an elemental metal or metal alloy.

In accordance with various embodiments of the disclosure, as illustrated in FIG. 6, a method for processing a wafer 102 is disclosed, the method may include providing a carrier 104 and a wafer 102, the wafer 102 having a first side 102a and a second side 102b opposite the first side 102a, the first side 102a of the wafer 102 being attached to the carrier 104, the second side 102b having a structure 208 at an edge region of the wafer 102, the structure 208 at least partially surrounding an inner portion 206 of the wafer 102; and printing material onto at least a portion of the second side 102b of the wafer 102. The structure 208 may be protruding from a surface 206a of the inner portion 206 of the wafer 102.

In one or more embodiments, the structure 208 may be configured as a reinforcement structure to increase mechanical stability of the wafer 102.

In one or more embodiments, the structure 208 may be a ring structure arranged to at least partially surround the inner portion 206 of the wafer 102.

In one or more embodiments, the ring structure may enclose the inner portion 206 of the wafer 102.

In one or more embodiments, the ring structure may be a circular ring structure.

In one or more embodiments, the structure 208 may be a Taiko ring structure.

In one or more embodiments, the carrier 104 may be a glass carrier.

In one or more embodiments, providing the carrier 104 and the wafer 102 includes attaching the first side 102a of the wafer 102 to the carrier 104 and removing wafer material from the inner portion 206 of the wafer 102 to form the structure 208 at the edge region of the wafer 102 to at least partially surround the inner portion 206 of the wafer 102.

In one or more embodiments, the printed material 508 may be a paste or a paste-like material.

In one or more embodiments, the printed material 508 may be at least one of an epoxy material, a metal, and a metal alloy.

In one or more embodiments, the first side 102a may be a front side of the wafer 102 and the second side 102b may be a back side of the wafer 102.

In one or more embodiments, printing material onto at least a portion of the second side 102b of the wafer 102 may include using at least one of a stencil mask, a screen mask, and a peelable photolayer (e.g. peelable photoresist).

In one or more embodiments, printing material onto at least a portion of the second side 102b of the wafer 102 may include printing the material onto at least a portion of the structure 208 at the edge region of the wafer 102, for example onto at least a portion of the top surface 208a of the structure 208 and/or onto at least a portion of one or more sidewalls 208b of the structure 208, as shown in FIG. 6.

In one or more embodiments, printing material onto at least a portion of the second side 102b of the wafer 102 may include printing the material onto at least a portion of the inner portion 206 of the wafer 102, e.g. onto at least a portion of the surface 206a of the inner portion 206 of the wafer 102.

In one or more embodiments, the printed material 508 may be printed through openings 702c in the stencil mask or screen mask 702a/702b onto the structure 208, and/or onto other parts of the back side 102b of the wafer 102 as is appropriate for various applications.

In one or more embodiments, printable material 508 may be wiped or squeegeed (e.g., using a squeegee 506, as shown) across the surface of the printing mask, e.g. stencil mask or screen mask, to deposit the printable material onto the second side 102b of the wafer 102, e.g. through one or more openings 702c in the printing mask.

In one or more embodiments, the wafer 102 may have a thickness (e.g. thickness T1 shown in the figures) of less than or equal to 220 μm, e.g. less than or equal to 175 μm, e.g. less than or equal to 150 μm, e.g. less than or equal to 100 μm, e.g. less than or equal to 50 μm, e.g. less than or equal to 20 μm, e.g. less than or equal to 10 μm, e.g. less than or equal to 5 μm.

In one or more embodiments, the thickness T2 of printed material 508 may be less than the height H1 of structure 208. For example, according to at least one embodiment, a flexible print screen and/or print mask may be used so that the thickness T2 of printed material 508 is less than the height H1 of structure 208.

Figure 7:
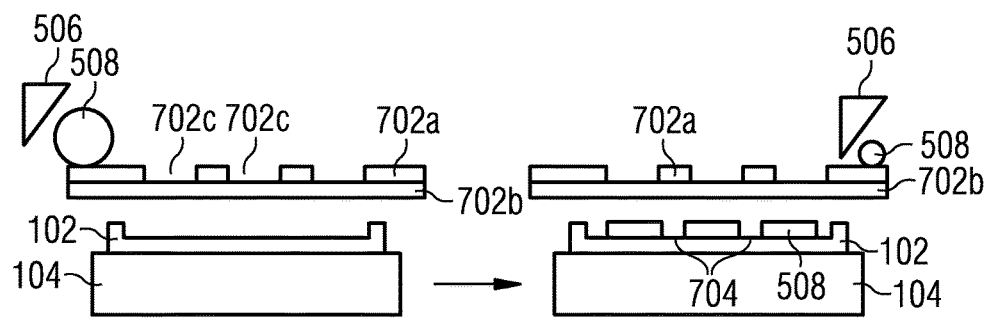
FIG. 7 show a wafer attached to a support structure in accordance with various embodiments with a print screen or stencil being used to print material onto a portion of the back side of a wafer so that dicing streets or kerf regions are left free of the printed material.

In one or more embodiments, the printed material 508 may cover the side 102b only partially. For example, in one or more embodiments, one more dicing regions may be free from printed material 508. In other words, in one or more embodiments, the printed material 508 may be printed on areas of the wafer 102 other than the dicing region or regions. For example, according to at least one embodiment, as illustrated in FIG. 7, a print screen and/or print mask may be used such that only portions of the back side 102b of the wafer 102 are covered in printed material 508, e.g. arranging a print mask so that dicing streets 704 (also known as kerf regions) are not covered in printed material 508. Dicing regions not covered in printed material 508 may, for example, facilitate a dicing process (die singulation) that may be carried out after the printing in accordance with one or more embodiments.

In one or more embodiments, the support structure (carrier) 104, e.g. glass carrier, may be detached from the wafer 102 after the printable material has been applied to the second side 102b of the wafer 102.

One or more embodiments may enable printing paste-like material onto a thinned wafer, e.g. a wafer having a thickness of less than or equal to 220 μm, e.g. less than 175 μm. In accordance with one or more embodiments, a carrier, e.g. glass carrier, technique is applied in combination with a reinforcement structure (e.g. a ring structure, e.g. Taiko ring) at an edge region of the wafer in order to increase mechanical stability of the wafer and enable screen or stencil printing onto very thin wafers. Due to the mechanical stability of the wafer with the reinforcement structure (e.g. ring structure, e.g. Taiko ring), it is possible to overcome limitations of mechanical stress otherwise occurring particularly at the edge region of the wafer. In accordance with one or more embodiments, the mechanical stability (including the protection of the wafer front side) provided by the glass carrier concept is used in combination with a Taiko ring to print paste or paste-like materials on the backside surface of a thin wafer.

While the invention has been particularly shown and described with reference to specific embodiments, it should be understood by those skilled in the art that various changes in form and detail may be made therein without departing from the spirit and scope of the invention as defined by the appended claims. The scope of the invention is thus indicated by the appended claims and all changes which come within the meaning and range of equivalency of the claims are therefore intended to be embraced.

What is claimed is:

1. A method for processing a wafer, the method comprising:
   removing wafer material from an inner portion of a back side of the wafer to form a structure at an edge region of the wafer to at least partially surround the inner portion of the wafer;
   printing material into the inner portion of the wafer using the structure as a printing mask in order to control the thickness of the material during printing according to the height of the structure,
   removing the structure at the edge region from the wafer so that the printed material remains in the inner portion of the wafer; and
   singulating the wafer after the removal of the structure from the wafer with the printed material remaining in the inner portion of the wafer,
   wherein the wafer is a semiconductor wafer.

2. The method of claim 1,
   wherein the structure is a ring structure arranged to at least partially surround the inner portion of the wafer.

3. The method of claim 2,
   wherein the ring structure is enclosing the inner portion of the wafer.

4. The method of claim 2,
   wherein the ring structure is a circular ring structure.

5. The method of claim 1,
   wherein the structure is a Taiko ring structure.

6. The method of claim 1,
   wherein the structure has a height of less than or equal to 25 μm.

7. The method of claim 1,
   wherein removing wafer material from the inner portion of the wafer comprises grinding wafer material from the inner portion of the wafer.

8. The method of claim 1,
   wherein removing wafer material from the inner portion of the wafer comprises removing wafer material from the inner portion of a backside of the wafer.

9. The method of claim 1,
   wherein the printed material is printed with a material thickness of less than or equal to 25 μm.

10. The method of claim 1,
    wherein the printed material comprises epoxy material.

11. The method of claim 10,
    wherein the epoxy material comprises metal.

12. The method of claim 1,
    wherein the printed material comprises metal.

13. A method for processing a wafer, the method comprising:
    providing a carrier and a wafer, the wafer having a first side and a second side opposite the first side, the first side of the wafer being attached to the carrier, the second side having a structure at an edge region of the wafer, the structure at least partially surrounding an inner portion of the wafer; and
    printing material onto at least a portion of the second side of the wafer using the structure as a printing mask in order to control the thickness of the material during printing according to the height of the structure;
    removing the structure at the edge region from the wafer so that the printed material remains on the second side of the wafer; and
    singulating the wafer after the removal of the structure from the wafer with the printed material remaining on the second side of the wafer,
    wherein the wafer is a semiconductor wafer.

14. The method of claim 13,
    wherein the structure is a ring structure arranged to at least partially surround the inner portion of the wafer.

15. The method of claim 13,
    wherein the ring structure is enclosing the inner portion of the wafer.

16. The method of claim 13,
    wherein the ring structure is a circular ring structure.

17. The method of claim 13,
    wherein the structure is a Taiko ring structure.

18. The method of claim 13, wherein the carrier comprises glass.

19. The method of claim 13, wherein providing the carrier and the wafer comprises:
    attaching the first side of the wafer to the carrier;
    removing wafer material from the inner portion of the wafer to form the structure at the edge region of the wafer to at least partially surround the inner portion of the wafer.

20. The method of claim 13, wherein the printed material comprises paste or a paste-like material.

21. The method of claim 13, wherein the first side is a front side of the wafer and the second side is a back side of the wafer.

22. The method of claim 13, wherein printing material onto at least a portion of the second side of the wafer comprises using at least one of a stencil mask and a screen mask.

23. The method of claim 13, wherein printing material onto at least a portion of the second side of the wafer comprises printing the material onto at least a portion of the structure at the edge region of the wafer.

24. The method of claim 13, wherein the wafer has a thickness of less than or equal to 220 μm.

25. The method of claim 13, wherein printing material onto at least a portion of the second side of the wafer comprises printing the material not onto a dicing region.

26. The method of claim 13, wherein the thickness of the printed material is less than a height of the structure.

* * * * *